United States Patent [19]
Tiemann

[11] Patent Number: 5,926,014
[45] Date of Patent: Jul. 20, 1999

[54] MAGNETIC SHIELD FOR PLASTIC MOLDED ELECTRICITY METER FRAMES

[75] Inventor: Jerome Johnson Tiemann, Schenectady, N.Y.

[73] Assignee: General Electric Company, Schenectady, N.Y.

[21] Appl. No.: 08/820,666

[22] Filed: Mar. 17, 1997

[51] Int. Cl.⁶ ............................. G01R 1/18; G01R 11/24; G01R 7/00
[52] U.S. Cl. ...................... 324/110; 324/137; 324/142; 324/156; 361/672
[58] Field of Search .................................... 324/110, 137, 324/141, 142, 151 R, 152, 156; 336/84 R, 84 C, 84 M; 361/672

[56] References Cited

U.S. PATENT DOCUMENTS

| | | | |
|---|---|---|---|
| 3,602,816 | 8/1971 | Van Bennekom | 324/156 X |
| 3,626,345 | 12/1971 | Funaki | 336/84 M |
| 4,030,031 | 6/1977 | Strucker | 324/137 X |
| 4,083,000 | 4/1978 | Becker | 324/137 |
| 4,760,333 | 7/1988 | Ichimura | 324/156 X |
| 5,027,061 | 6/1991 | Palmer et al. | 324/110 X |
| 5,239,259 | 8/1993 | Todoroki et al. | 324/156 X |
| 5,457,872 | 10/1995 | Sakata et al. | 336/84 M X |
| 5,486,755 | 1/1996 | Horan et al. | 324/110 |

*Primary Examiner*—Gerard Strecker
*Attorney, Agent, or Firm*—Marvin Snyder; Douglas E. Stoner

[57] ABSTRACT

Magnetic shields for plastic molded electricity meter frames are positioned to substantially block external magnetic fields from adversely affecting operation of meter components. The shield can be utilized with either electromechanical or electronic energy meters. In an electromechanical watthour meter which employs an aluminum disk driven to rotate through a magnetic field produced by a retarding magnet, the meter frame includes an integrally formed retarding magnet shield and an integrally formed bearing shield. The shields are coextensive with the frame, and extend from an inner periphery of the frame toward the retarding magnet and the bearing, respectively. The shields are formed of a magnetically permeable powder, such as a ferrite powder mixed with the plastic material from which the meter frame is molded. The shields divert externally applied fields away from the magnetically sensitive components of the meter without adversely affecting meter accuracy.

9 Claims, 1 Drawing Sheet

MAGNETIC SHIELD FOR PLASTIC MOLDED ELECTRICITY METER FRAMES

FIELD OF THE INVENTION

This invention relates generally to electricity meters and, more particularly, to magnetic shielding in a plastic molded meter frame for meter components sensitive to external magnetic fields.

BACKGROUND OF THE INVENTION

Electricity meters are utilized to measure consumption of energy by a load and include components such as current and voltage coils which are sensitive to external magnetic fields. For example, in an electronic meter, a processor (e.g., an application specific integrated circuit) receives input current and voltage signals from current and voltage coils, and uses such signals to generate a measure of energy consumption. The current and voltage coils are coupled to the power lines that supply energy to the load. If an external magnetic field interacts with the coils, meter accuracy can be adversely affected.

In an electromechanical meter, an aluminum disk is supported on a shaft and is driven to rotate by magnetic fields at a speed proportional to electric power being consumed by the load. The shaft is supported by a bearing so that very little friction acts on the shaft. A voltage coil and a current coil, positioned on respective, opposite sides of the disk, are coupled to the power lines supplying energy to the load. A permanent magnet, sometimes referred to as a retarding magnet, is spaced from the voltage and current coils and is positioned so that its poles are on opposite sides of the disk. The energized voltage and current coils generate magnetic fields which impart a rotational torque to the disk while the field of the permanent magnet imparts a retarding torque to the disk. If an external magnetic field interacts with the coils, the bearing, or the retarding magnet, accuracy of the meter can be adversely affected.

Since the readings of an electricity meter form the basis for income to electric utilities, it is important that the meter accurately measure energy consumption and not be subject to inaccuracies that might be due to tampering. For example, accuracy of an electronic meter can be adversely affected by a strong permanent magnet positioned near enough to the current coils to affect signals generated by the coils. Similarly, accuracy of an electromechanical meter can be adversely affected by a strong permanent magnet positioned near the coils, the bearing, or the retarding magnet.

Until recently, compact permanent magnets with sufficient magnetic strength to adversely affect meter components had not been generally available. Since such magnets are now generally available, it would be desirable to design electricity meters in a way that protects meter components from tampering by use of such magnets.

Recently, both electronic and electromechanical meter frames have been molded from plastic. In an electronic meter, the meter frame is configured to support the voltage and current coils, and the circuit boards are utilized to process signals from the coils. In an electromechanical meter, the meter frame supports the voltage and current coils, as well as the bearing and the retarding magnets.

Plastic molded meter frames are lower in cost than previously used die cast meter frames, facilitating more cost efficient energy consumption metering. However, these lower cost plastic molded frames can be even more susceptible to tampering with a permanent magnet, as described above, than metallic frames. Therefore, it would be desirable to provide an effective way of substantially reducing the opportunity for tampering without significantly increasing the cost of the plastic molded frame, so that the cost advantages of the plastic molded frame are substantially preserved. In addition, the tamper resistant feature of such frame should preferably be relatively indiscernible so as to avoid drawing attention to the magnetic shielding structure of the frame.

SUMMARY OF THE INVENTION

Magnetic shields are provided for plastic molded meter frames in order to substantially prevent external magnetic fields from adversely affecting operation of the meter components. The shields can be utilized in connection with either electromechanical or electronic energy meters. For example, in an electromechanical watthour meter, the meter frame includes an integrally formed retarding magnet shield and an integrally formed bearing shield. The shields are coextensive with the frame, and extend from an inner surface of the frame toward the retarding magnet and the bearing, respectively.

To form the shields, and as a process step in the frame molding process, a magnetically permeable powder, such as a permeable ferrite powder, is mixed with the plastic material from which the meter frame is molded. Such mixed powder/plastic material is then supplied to jets which fill the portions of the mold for the shields while only the plastic material (i.e., not the mixed powder) is supplied by other jets to other portions of the meter frame mold. In this manner, magnetic and non-magnetic plastics are molded in different regions of the integral meter frame in a single operation.

In an alternative embodiment, a sheet metal stamping of magnetically permeable material, such as iron, is inserted into the mold prior to an injection molding step. The sheet metal stamping is located in the mold so that when the meter components are secured to the meter frame, the stamping at least partially blocks external magnetic fields from at least one component. With the sheet metal stamping located in the mold, the plastic is injected into the mold, including around the sheet metal stamping, thereby securing the sheet metal stamping in place by being integral with the mold.

The above described shields can effectively divert an externally applied field away from the retarding magnet and the bearing. In addition, the retarding magnet shield is sufficiently spaced from the retarding magnet so as not to divert its retarding magnetic field. In this manner the shields desirably prevent externally applied fields from adversely affecting the retarding magnet and the bearing without themselves adversely affecting the meter accuracy.

DETAILED DESCRIPTION OF THE DRAWINGS

Magnetic shields in accordance with various embodiments of the present invention are described in detail herein in connection with a single phase electromechanical watthour meter and an electronic meter. The magnetic shields, however, can be used in various other electromechanical and electronic meters having plastic molded meter frames and therefore are not limited to use in any particular type of meter.

Figure 1:
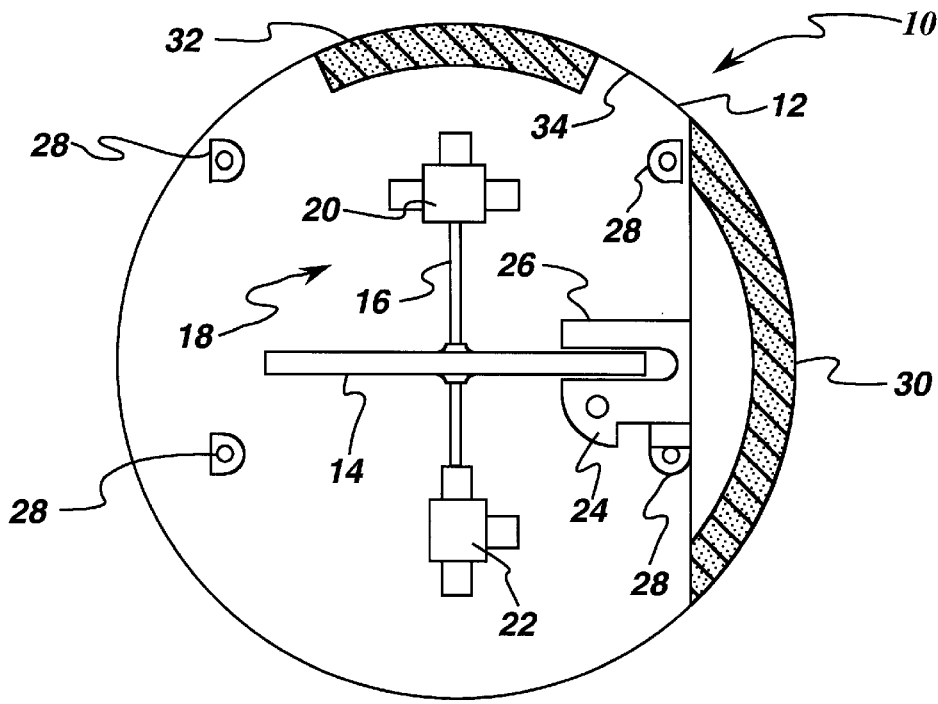
FIG. 1 is a schematic illustration of an electromechanical watthour meter including magnetic shields in accordance with one embodiment of the invention.

FIG. 1 is a schematic illustration of a single phase electromechanical watthour meter 10 including a plastic molded meter frame 12. Meter 10 includes an aluminum disk 14 affixed to a shaft 16 supported on a bearing assembly 18 including an upper bearing 20 and a lower bearing 22. A permanent magnet keeper 24 supports a retarding magnet 26 positioned so that its poles are on opposite side of disk 14. Meter frame 12 includes face plate supports 28 for mating with threaded screws. Of course, meter 10 includes many other components which are not shown in FIG. 1, and such components, including their operation, are well known in the art.

Meter frame 12 is molded of a low cost plastic such as polyvinyl chloride (PVC). In accordance with one embodiment of the invention, meter frame 12 includes a retarding magnet shield 30 and a bearing shield 32. Shields 30 and 32 are integral with, and coextensive with, frame 12, and extend inward from an inner surface 34 of frame 12 toward retarding magnet 26 and bearing 20, respectively, serving to divert externally applied magnetic fields away from magnet 26 and bearing 20, respectively.

Retarding magnet shield 30 is spaced from retarding magnet 26 so as not to divert the retarding magnetic field of magnet 26. Shields 30 and 32 therefore provide the desired result of preventing externally applied fields from adversely affecting retarding magnet 26 and bearing 20 without themselves adversely affecting accuracy of meter 10.

Shields 30 and 32 are formed as a process step in the frame molding process. A magnetically permeable powder, such as a permeable ferrite powder, is mixed with the plastic material from which meter frame 12 is molded. Such mixed powder/plastic material is then supplied to jets which fill the portions of the mold for shields 30 and 32 while only the plastic material (i.e., not the mixed powder) is supplied by other jets to other portions of the mold. In this manner, magnetic and non-magnetic plastics are molded in different regions of an integral frame 12 in a single operation.

Figure 2:
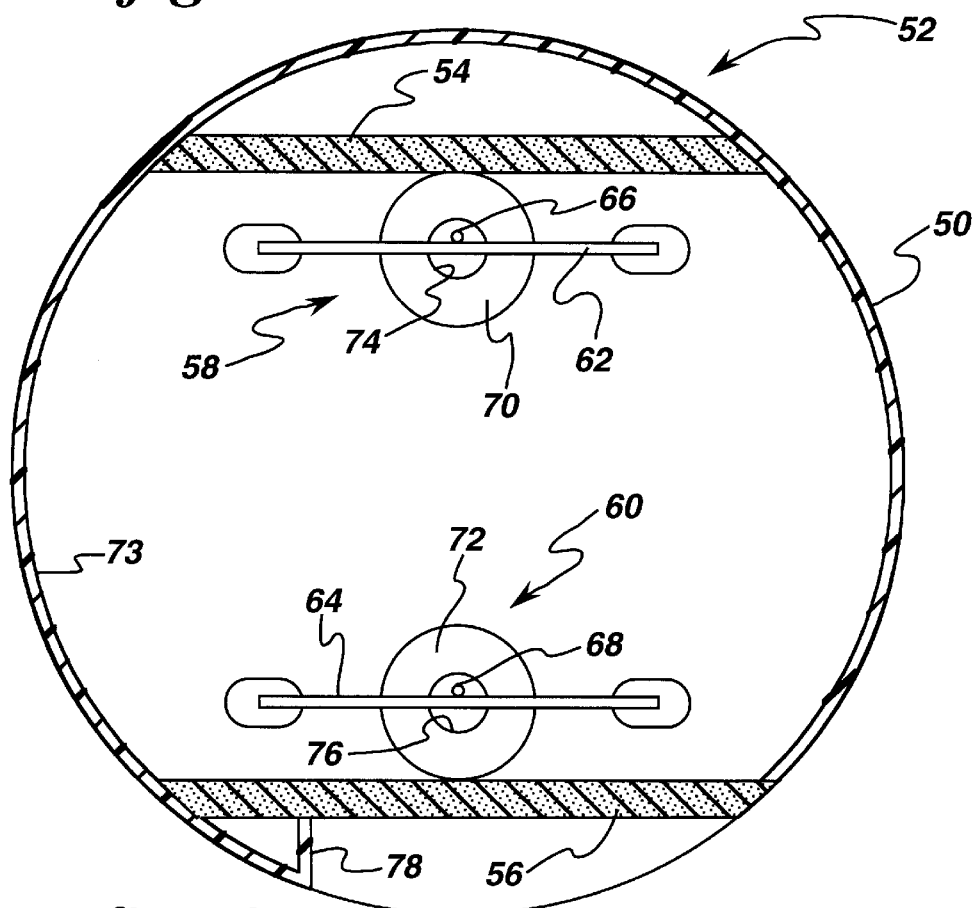
FIG. 2 is a schematic illustration of a meter frame for an electronic watthour meter including magnetic shields in accordance with another embodiment of the invention.

FIG. 2 is a schematic illustration of a plastic molded meter frame 50 for an electronic watthour meter 52 including magnetic shields 54 and 56 in accordance with another embodiment of the invention. Current sensors 58 and 60 are secured to meter frame 50 and include conducting bars 62 and 64, respectively, and power sampling shunt conductors 66 and 68 electrically connected to respective conducting bars 62 and 64. Sensors 58 and 60 further include toroidal coils 70 and 72, respectively, and shunt conductors 66 and 68 extend through openings 74 and 76 in coils 70 and 72, respectively. Current sensors 58 and 60 are well known in the art.

Meter frame 50 is molded using a low cost plastic such as PVC, and includes current sensor magnet shields 54 and 56. Shields 54 and 56 are integral and coextensive with frame 50, and each extends from a separate respective first location on an inner surface 72 of frame 50 to a separate respective second location on the inner surface of frame 50, so as to be situated adjacent respective sensors 58 and 60. A support rib 78 extends from inner surface 72 of frame 50 to shield 56 to provide additional strength and rigidity for shield 56.

Shields 54 and 56, while effective in diverting an externally applied field away from current sensors 58 and 60, do not divert the field produced by shunt conductors 66 and 68. Shields 54 and 56 therefore provide the desired result of preventing externally applied fields from adversely affecting current sensors 58 and 60 without themselves adversely affecting the accuracy of meter 52.

Shields 54 and 56 are formed as a process step in the frame molding process in the same manner as described for shields 30 and 32 in the embodiment shown in FIG. 1. Alternatively, the meter magnetic components can be separately assembled/molded to form sub-assemblies. For example, each current sensor is separately assembled, and each magnetic shield is molded separately from the meter frame. The current sensors and shields are then secured to the meter frame using, for example, an adhesive, such as an epoxy adhesive.

In yet another alternative assembly process, a sheet metal stamping of magnetically permeable material, such as iron, is inserted into the mold prior to injection molding. The sheet metal stamping is positioned in the mold so when the meter components are secured to the meter frame, the stamping will at least partially block external magnetic fields from at least one component. With the sheet metal stamping positioned in the mold, the plastic is injected into the mold, including around the sheet metal stamping, thereby securing the sheet metal stamping in place; i.e., the sheet metal stamping is formed integral with the plastic.

Meter frames of the type shown in FIGS. 1 and 2, and many variations thereof, are well known. Meters including such frames are commercially available from General Electric Company, Somersworth, N.H. The shields described herein can also be used with various other meter frame configurations. Moreover, because these shields are low in cost, their use in metering of energy consumption as described herein is cost efficient without adversely impacting accuracy of energy consumption metering.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. An electricity meter for measuring load energy consumption, said meter comprising a plastic meter frame, first and second current sensors secured to said frame and sensitive to external magnetic fields, each of said current sensors including a respective power sampling shunt conductor, and a first magnetic shield positioned to at least partially divert an external magnetic field away from said first current sensor and a second magnetic shield positioned to at least partially divert an external magnetic field away from said second current sensor, said magnetic shields being secured to said meter frame and positioned to avoid diverting a magnetic field produced by said shunt conductors.

2. An electricity meter in accordance with claim 1 wherein each of said magnetic shields comprises a mixture of permeable ferrite powder and plastic.

3. An electricity meter in accordance with claim 1 wherein said meter frame and said magnetic shields are integral.

4. An electricity meter in accordance with claim 1 wherein each of said magnetic shields comprises a metal sheet surrounded by plastic.

5. An electricity meter in accordance with claim 1 wherein each of said shields comprises a magnetically permeable ferrite powder and is adapted to be formed integral with the meter frame and to be positioned to at least partially divert an external magnetic field away from the meter component.

6. An electricity meter for measuring load energy consumption, said meter comprising a plastic meter frame, a rotatable disk, a rotatable shaft secured to said disk, a bearing sensitive to magnetic fields, said bearing being secured to said frame and supporting said shaft, a retarding magnet secured to said frame, a first magnetic shield positioned to at least partially divert an external magnetic field away from said bearing, and a second magnetic shield positioned to at least partly divert an external magnetic field away from said retarding magnet, said magnetic shields being secured to said meter frame.

7. An electricity meter in accordance with claim 6 wherein each of said magnetic shields comprises a mixture of permeable ferrite powder and plastic.

8. An electricity meter in accordance with claim 6 wherein said meter frame and said magnetic shields are integral.

9. An electricity meter in accordance with claim 6 wherein each of said magnetic shields comprises a metal sheet surrounded by plastic.

* * * * *